United States Patent [19]

Peppler et al.

[11] 4,285,118
[45] Aug. 25, 1981

[54] CABLE HARNESS ASSEMBLY AND ELECTRICAL TESTING MACHINE

[75] Inventors: Michael S. Peppler, Lancaster; Johannes C. W. Bakermans, Harrisburg, both of Pa.

[73] Assignee: AMP Incorporated, Harrisburg, Pa.

[21] Appl. No.: 906,536

[22] Filed: May 17, 1978

Related U.S. Application Data

[62] Division of Ser. No. 772,204, Feb. 25, 1977, Pat. No. 4,110,880.

[51] Int. Cl.³ .................. G01R 31/08; H01R 43/00
[52] U.S. Cl. ................................... 29/593; 29/854; 324/52; 324/73 AT
[58] Field of Search .............. 29/628, 624, 755, 593, 29/749, 753, 747, 761, 407; 324/66, 73 AT, 52, 158; 339/17 F

[56] References Cited

U.S. PATENT DOCUMENTS

| 3,259,968 | 7/1966 | Dyksterhouse | 29/624 |
| 3,758,935 | 9/1973 | Long et al. | 29/749 X |
| 3,820,055 | 6/1974 | Huffnagle et al. | |
| 3,885,287 | 5/1975 | Long et al. | |
| 3,963,319 | 6/1976 | Schumacher et al. | 339/17 F X |
| 4,005,518 | 2/1977 | Bakermans | |
| 4,020,540 | 5/1977 | Casciotti et al. | |
| 4,043,017 | 8/1977 | Folk et al. | |
| 4,137,624 | 2/1979 | Davis et al. | 29/749 X |
| 4,148,130 | 4/1979 | Stauffer et al. | 29/749 X |

Primary Examiner—Francis S. Husar
Assistant Examiner—C. J. Arbes
Attorney, Agent, or Firm—Russell J. Egan

[57] ABSTRACT

An assembly apparatus is disclosed for manufacturing cable harnesses having a measured length of a multi-conductor flat flexible cable terminated by at least two electrical connectors. The assembly apparatus includes a conductor testing and cable cutting station, a connector crimp termination station, and a test fixture which electrically tests each connector for shorts and opens simultaneously with the crimping of the connector onto the cable.

5 Claims, 19 Drawing Figures

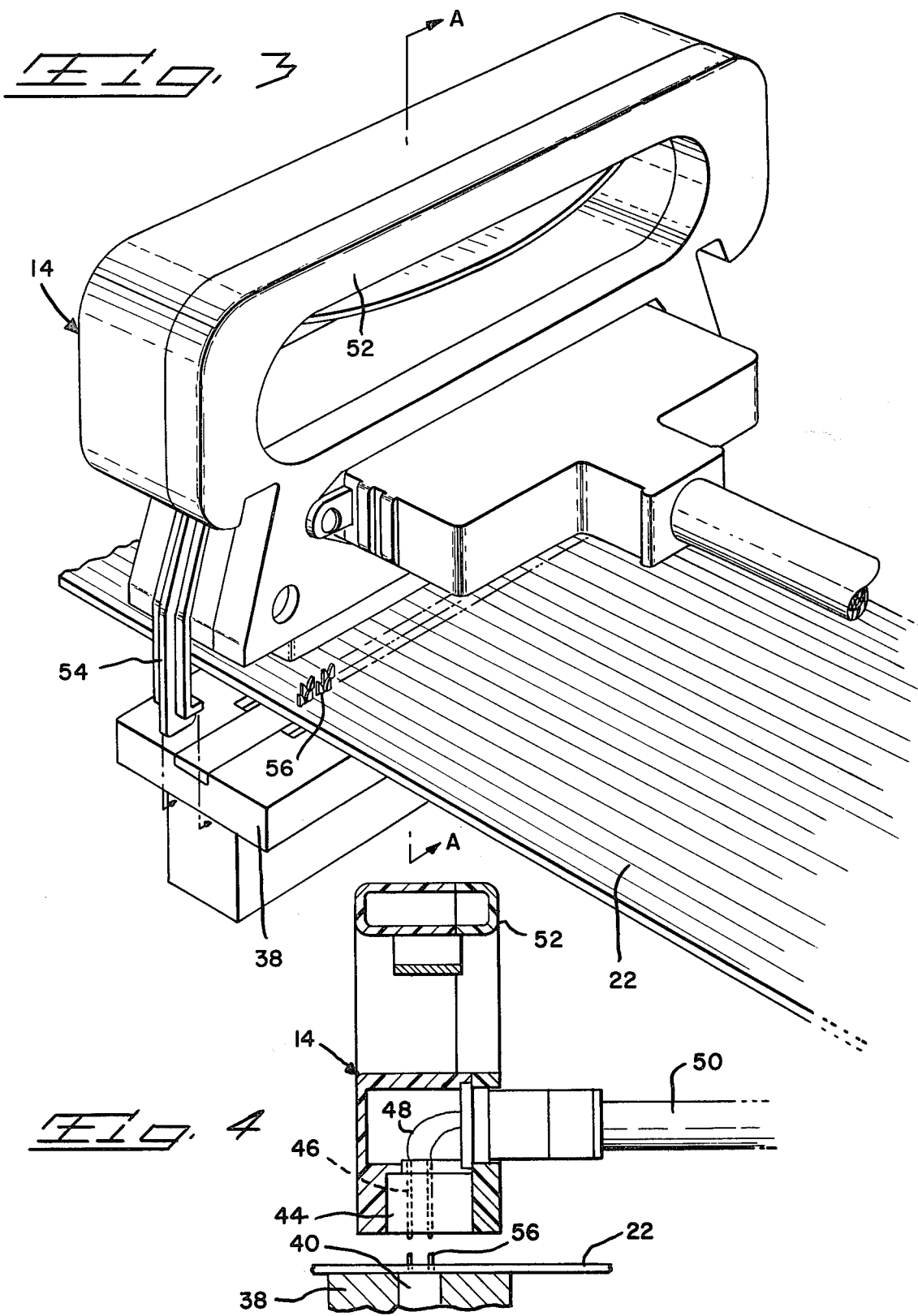

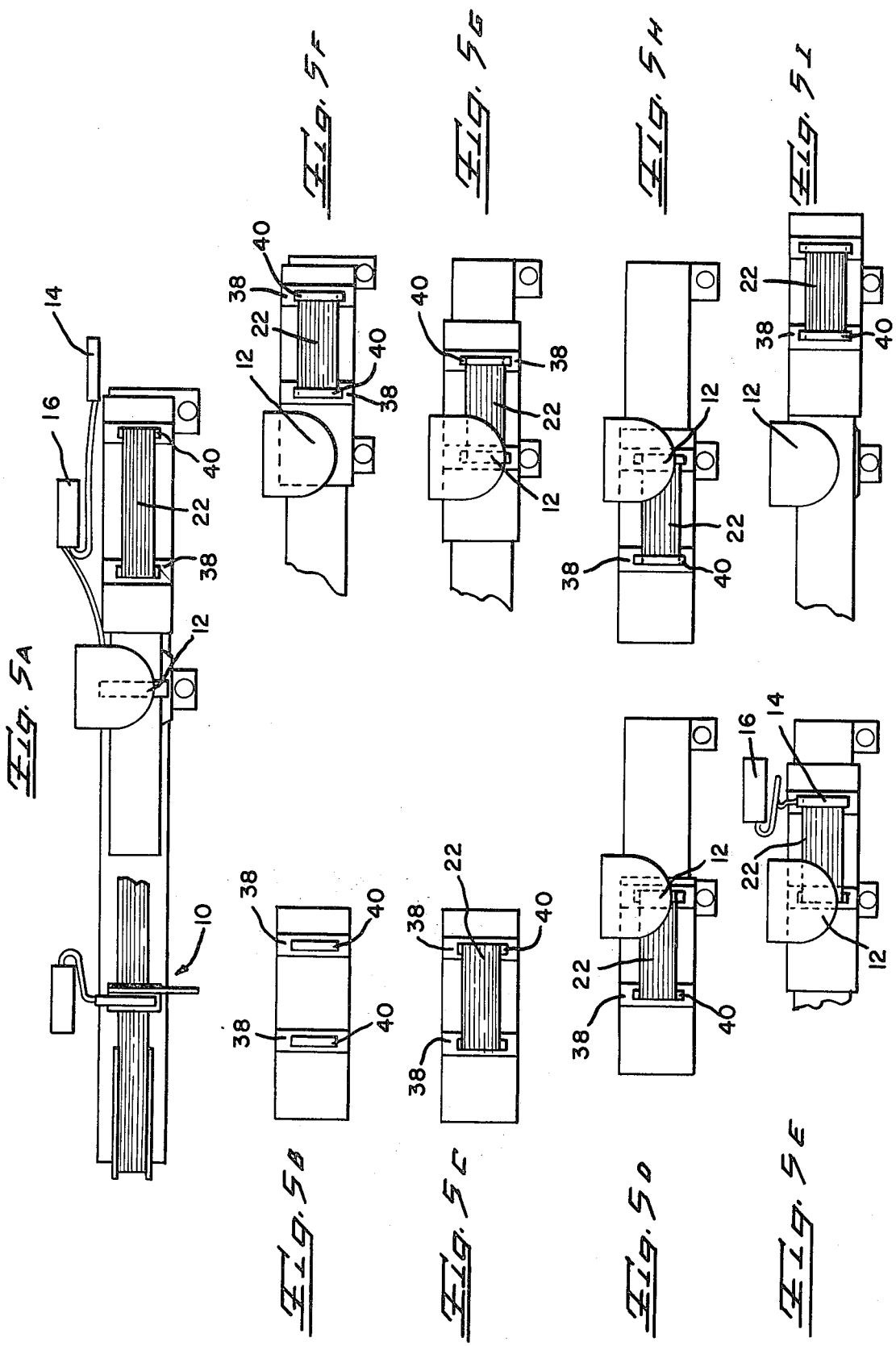

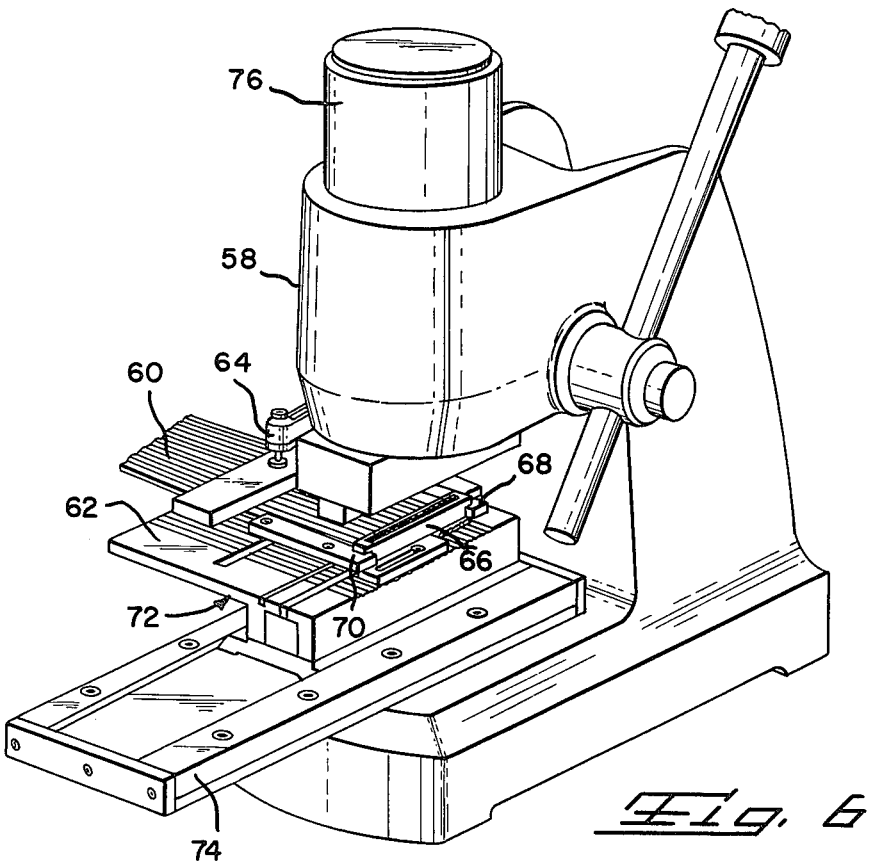
_Fig. 6_
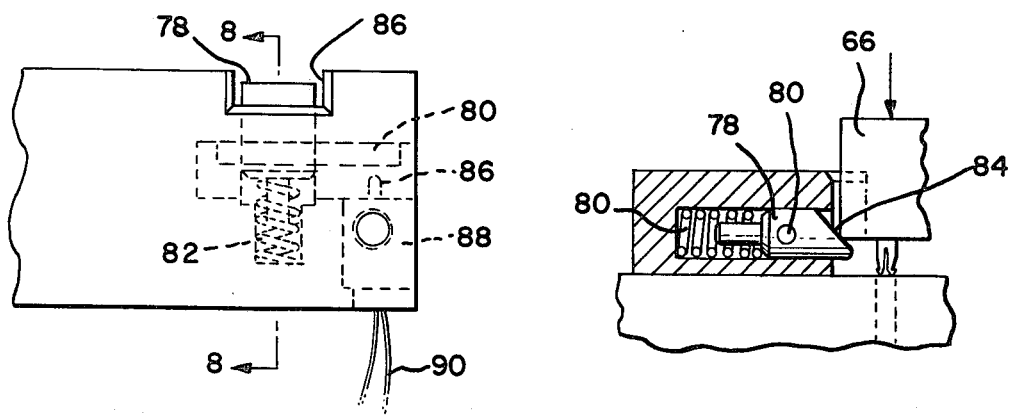
_Fig. 7_  _Fig. 8_

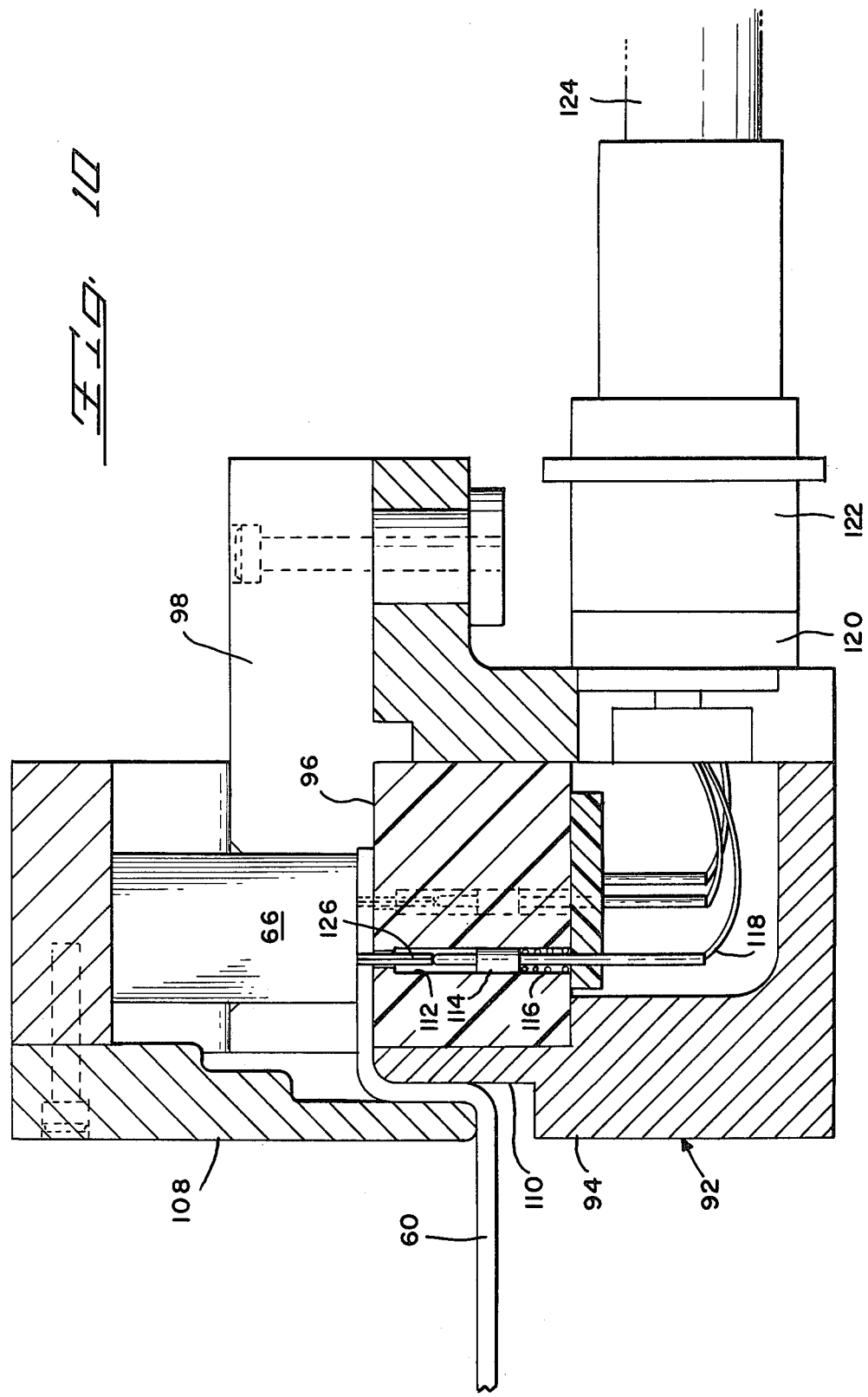

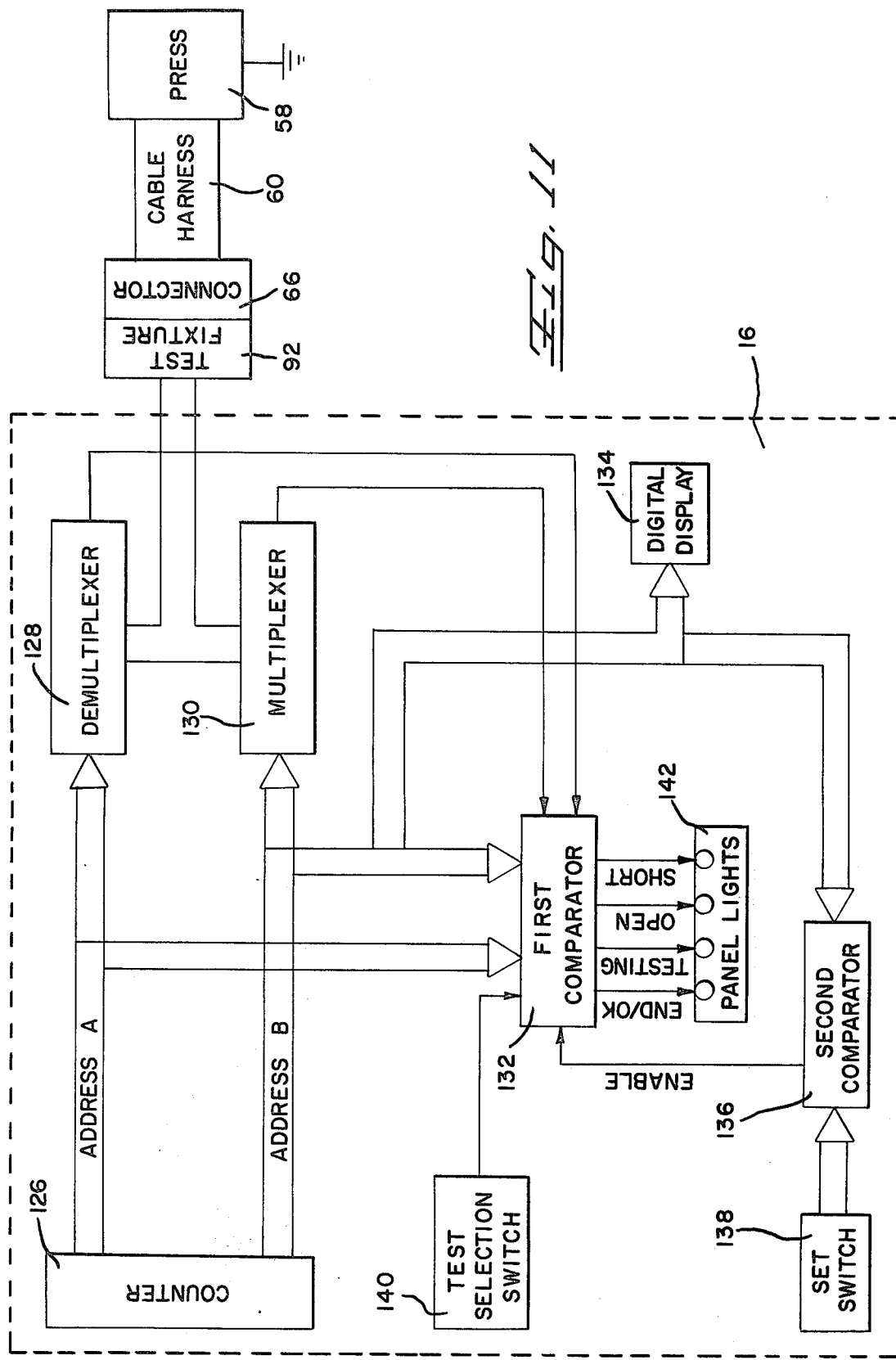

CABLE HARNESS ASSEMBLY AND ELECTRICAL TESTING MACHINE

This is a division of application Ser. No. 772,204, filed Feb. 25, 1977 now U.S. Pat. No. 4,110,880.

BACKGROUND OF THE INVENTION

1. The Field Of The Invention

The present invention relates to an apparatus for assembling electrical connectors on multi-conductor flat flexible cable and in particular to an apparatus for simultaneously testing the cable and connector for opens and shorts while terminating the cable with the connector.

2. The Prior Art

There are certain problems which are inherent in the manufacture of cable harness assemblies. These problems involve assurance that each contact of each connector makes a proper engagement with the appropriate conductor of the cable and that no opens or shorts occur throughout the entire assembly. Clearly the problem is magnified when a series of connectors are to be attached at spaced intervals along a run of cable in daisy chain fashion. Should there be a lack of continuity at one point, it will effect the acceptability of the entire cable harness.

It is always possible to make a continuing series of continuity checks but this would be a cumbersome and tedious job when it is desired to have a good production rate of cable assemblies. The present invention intends to overcome the disadvantages of the prior known techniques by providing an apparatus which can be used to sequentially attach electrical connectors to flat flexible cable in sequential fashion and to test each connection simultaneously with the engagement of the conductors and contacts.

SUMMARY OF THE INVENTION

The present invention therefore comprises a cable harness assembly apparatus having a cable testing and cutting unit, a connector crimping unit and an electrical continuity testing unit. The cable testing and cutting unit has a pair of parallel spaced cutting blades with a comb-like member fixed therebetween. The comb-like member has a plurality of parallel spaced pin contacts which extend beyond the cutting edges of the blades so as to penetrate the cable insulation and engage the respective conductors of a multiple conductor ribbon cable, prior to severing the cable at a determined length. The pin contacts are electrically connected to a read-out unit and determine if the conductors are correctly located within the web of the cable. The connector crimp termination station has a cable guide, connector guide means, and a press apparatus for applying a force against a connector to drive contacts carried thereby into engagement with the respective conductors of the cable. The test assembly includes a test fixture, which is engaged with the first connector crimped onto the cable, and means to electrically measure and test each subsequent connector for shorts and opens simultaneously with the application of the connector to the cable.

It is therefore an object of the present invention to produce an improved cable harness assembly apparatus which tests for correct location of conductors in a multi-conductor flat flexible cable immediately prior to cutting the cable to the desired length.

It is a further object of the present invention to produce an improved cable harness assembly apparatus in which individual contacts of a multi-contact connector are checked for continuity simultaneously with the engagement of the connector to a multi-conductor flat flexible cable.

It is a further object of the present invention to produce a cable harness assembly apparatus which is capable of making harness assemblies at a high rate of production and with a low rate of rejection.

It is a still further object of the present invention to produce an improved cable harness assembly apparatus which can be readily and economically produced.

The means for accomplishing the foregoing objects and other advantages will become apparent to those skilled in the art from the following detailed description taken with reference to the accompanying drawings.

BRIEF DESCRIPTION OF THE DRAWINGS

FIG. 3 is an enlarged perspective view of a test fixture according to a first embodiment of the present invention;

FIG. 4 is a vertical transverse section taken along line A—A of FIG. 3;

FIGS. 5A to 5I are a series of schematic drawings showing the operational sequence of steps employed by the present invention;

FIG. 6 is a perspective view of a second embodiment of the crimping station according to the present invention;

FIG. 7 is an enlarged top plan view of a portion of one guide member of FIG. 6;

FIG. 8 is an enlarged vertical section taken along line 8—8 of FIG. 7;

FIG. 10 is a vertical transverse section taken along line 10—10 of FIG. 9; and

FIG. 11 is a block level schematic of the electrical circuit of the subject invention.

DETAILED DESCRIPTION OF THE PREFERRED EMBODIMENT

Figure 1:
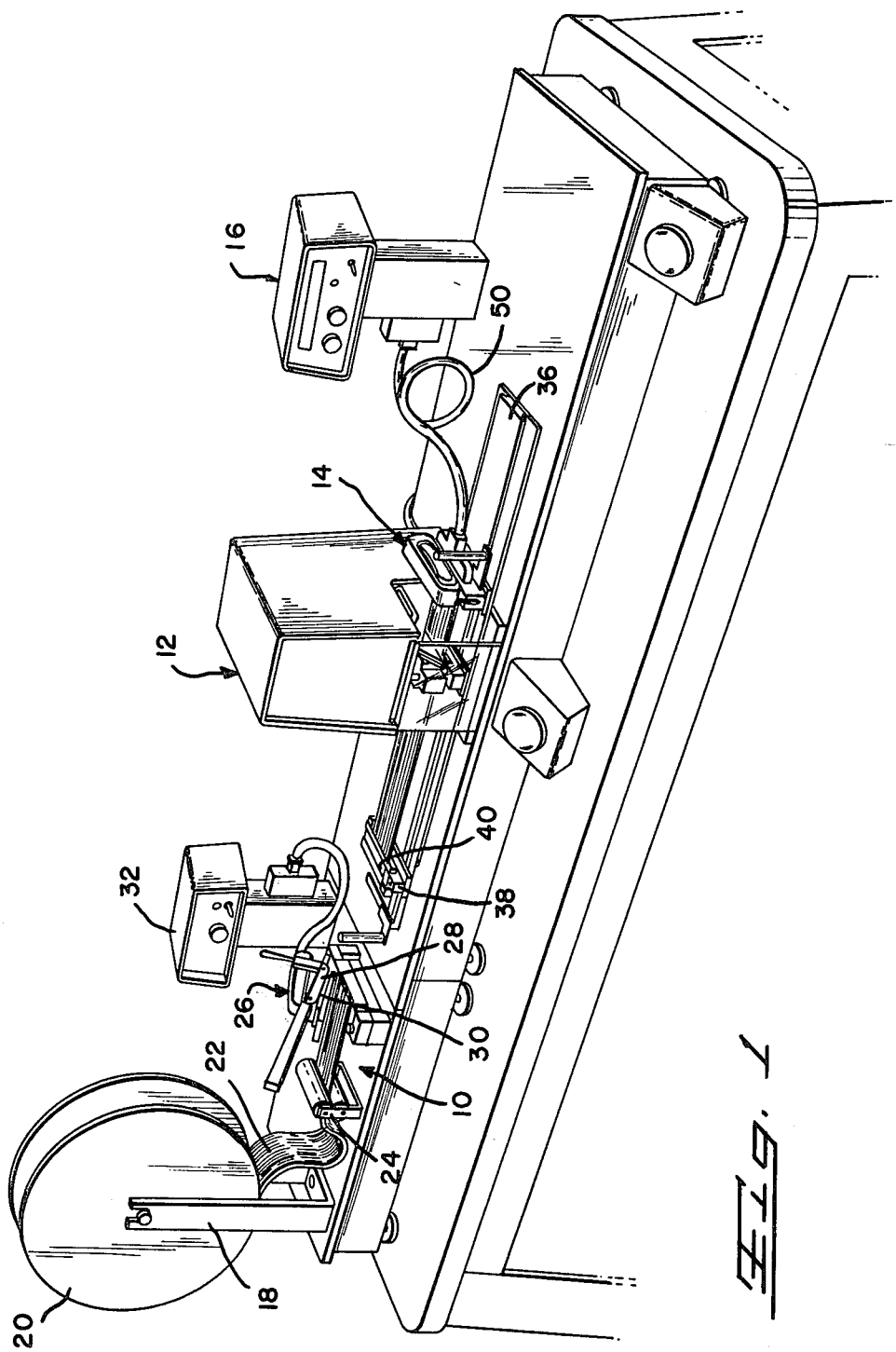
FIG. 1 is a perspective view of the entire assembly apparatus according to the present invention.

A first embodiment of the assembly apparatus according to the present invention is shown in FIG. 1 and includes a cable testing and cutting station 10, a connector crimp terminating station 12, a test fixture 14 and test indication station 16. The subject apparatus is used to form cable harnesses by attaching at least two contact carrying connectors at predetermined intervals along measured lengths of multi-conductor ribbon cable.

The cable cutting station 10 includes a frame 18 supporting a spool 20 of conventional, commercially available multi-conductor flat flexible cable 22. The cable is fed between a pair of parallel, spaced rollers 24 to a cutter assembly 26 which includes a pair of parallel spaced cutting blades 28, and a comb-like member having a plurality of parallel, spaced, sharp, thin contacts 30 disposed between the cutting blades. The pin contacts 30 project beyond the cutting edges of the blades 28 and are electrically connected to a test indicator 32.

The cable 22 is fed through and straightened by the rollers 24 which also apply a drag on the cable to retard unwanted unreeling. The cable is positioned beneath the cutting blades 28 and comb-like member 30. As the cutting blades are lowered, the pin contacts 30 penetrate the insulation of the cable and, if the conductors are correctly located, engage the conductors with a positive indication of this engagement being displayed on the test indicator 32. If a conductor is out of tolerance so that no contact is made, an appropriate indication will be registered on the test indicator 32. The subsequent continuing closing movement of the cutting blades will remove the portion of the cable damaged from the testing. The cable is measured and a second cut is made in a similar fashion to the first cut with a simultaneous test for location of the conductors.

Figure 2:
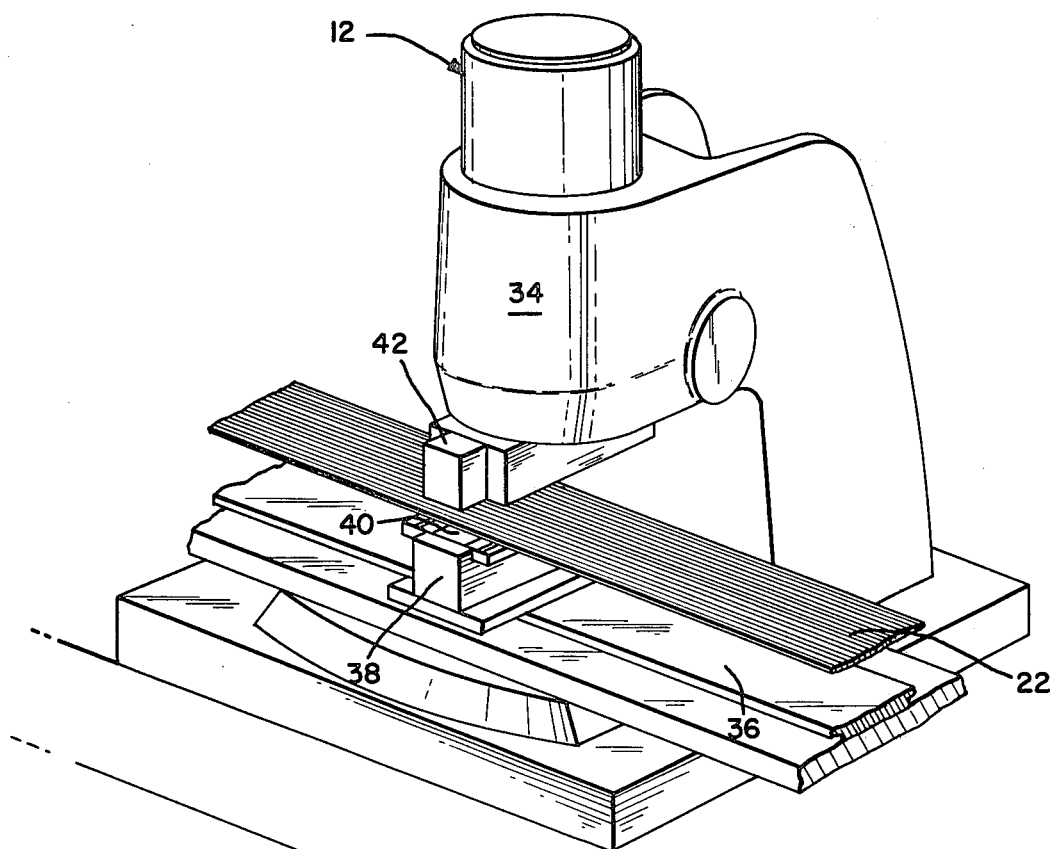
FIG. 2 is an enlarged view of a first embodiment of the crimping station according to the present invention.

The connector crimp terminating station 12 is shown in FIG. 2 with the normal covers removed to reveal a conventional fluid or electrically actuated press 34 of the type shown in U.S. Pat. No. 4,020,540. A fixed guide 36 extends transversely beneath the press. A plurality of carriers 38, such as those described in U.S. Pat. No. 4,005,518, are slidably mounted on the guide 36 in the manner described in said patent. Each carrier 38 is adapted to be loaded with a contact carrying connector 40, such as those shown in U.S. Pat. No. 3,820,055.

A contact carrying connector 40 is loaded in each carrier 38 in a contact up position, as seen in FIGS. 3 and 4. The carriers 38, loaded with connectors 40, and cable 22 are sequentially moved to a crimping position beneath ram 42 of the press 34 and the ram is actuated to effect the connection in the well known manner, as described in U.S. Pat. No. 3,820,055.

The first connector crimped onto the cable is engaged with test fixture 14, shown in detail in FIGS. 3 and 4. The test fixture 14 has a test block 44 having a plurality of contacts 46 mounted therein and connected by conductors 48 and cable to the test indication station 16. The fixture 14 also has a handle portion 52 and a pair of spaced, inwardly directed latching members 54 for detachably securing the fixture 14 to the carrier 38 and holding it in such a position that the contacts 56 of the connector 40 engage the contacts 46 of the test fixture 14. This engagement is used for electrical continuity testing to obtain readings of open or short between the contacts of the connector and conductors of the cable.

FIGS. 5A to 5I show the sequential steps of assembling a cable harness with the subject apparatus. The first step, shown in FIG. 5A, is to measure and cut the desired length of cable off the reel. The cutting of the cable also effects testing for correct location of the conductors as discussed above. Each carriers 38 is loaded with connector 40 in a contact up position, as shown in FIG. 5B. The cut length of cable 22 is laid on the carriers and clamped in position as shown in FIG. 5C. The first carrier 38 is indexed under the press 34, as shown in FIG. 5D, and the crimping action is effected. The test probe 14 is engaged with the first connector 40 and the second carrier 38 is indexed to place the next connector 40 under the press 34, as shown in FIG. 5E. As the crimp of this connector is effected, the reading on the test indication station 16 is observed for a continuity and short readout. The cable, with the connectors terminated thereon, is removed from the carriers 38, as shown in FIG. 5F, and connector covers are placed in the carriers. The last connector 40 is indexed back under the press 34 and crimped to attach the cover to the connector 40, as shown in FIG. 5G, and the same operation is repeated to attach the cover on the other connectors, as shown in FIG. 5H. The entire completed cable harness assembly is unloaded from the apparatus as shown in FIG. 5I.

It should be here noted that the subject apparatus is intended for use with a connector, such as that shown in U.S. Pat. No. 3,820,055, which has a plurality of contacts fixedly mounted in a housing with insulation displacing conductor engaging portions extending from a cable contacting face. The cable is preferably multiconductor flat flexible cable and can have either solid or stranded conductors, with either a round or a flat section, covered by either laminated or extruded insulation.

An alternate embodiment of the press portion of the present invention is shown in FIGS. 6 to 8. The illustrated press 58 is manually operated and of the type described in U.S. Pat. No. 4,020,540. It should be noted that this press can also be electrically or fluid actuated without departing from the spirit or essential characteristics of the invention.

The press 58 shown in FIG. 6 differs from the previous press 34 primarily in the placement of the connector for crimping on the cable and the manner of making the electrical tests. In this embodiment the cable 60 is clamped to a fluted base 62 by clamp assembly 64 for correct positioning of the conductors. A connector 66, of the type described in U.S. Pat. No. 3,820,055, is positioned in a contact down condition between fixed guide member 68 and adjustable guide member 70 both of which are secured to the base 62. The entire base assembly 72 is mounted on guide rails 74 to slide from a forward loading position to a rear crimping position beneath the ram 76 of the press 34, as shown. One of the guide members 68, 70 includes a plunger 78 carrying an actuator arm 80 and is biased by spring 82 to have its cam surface 84 normally projecting into connector guide cavity 86. The actuator arm 80 is positioned to actuate the plunger 86 of a switch 88. The switch is connected to the test indicator station 16 by conductors 90. The plunger 78 also serves to assist in driving the crimped connector 66 from the guides 68, 70 when the ram 76 is released.

Figure 9:
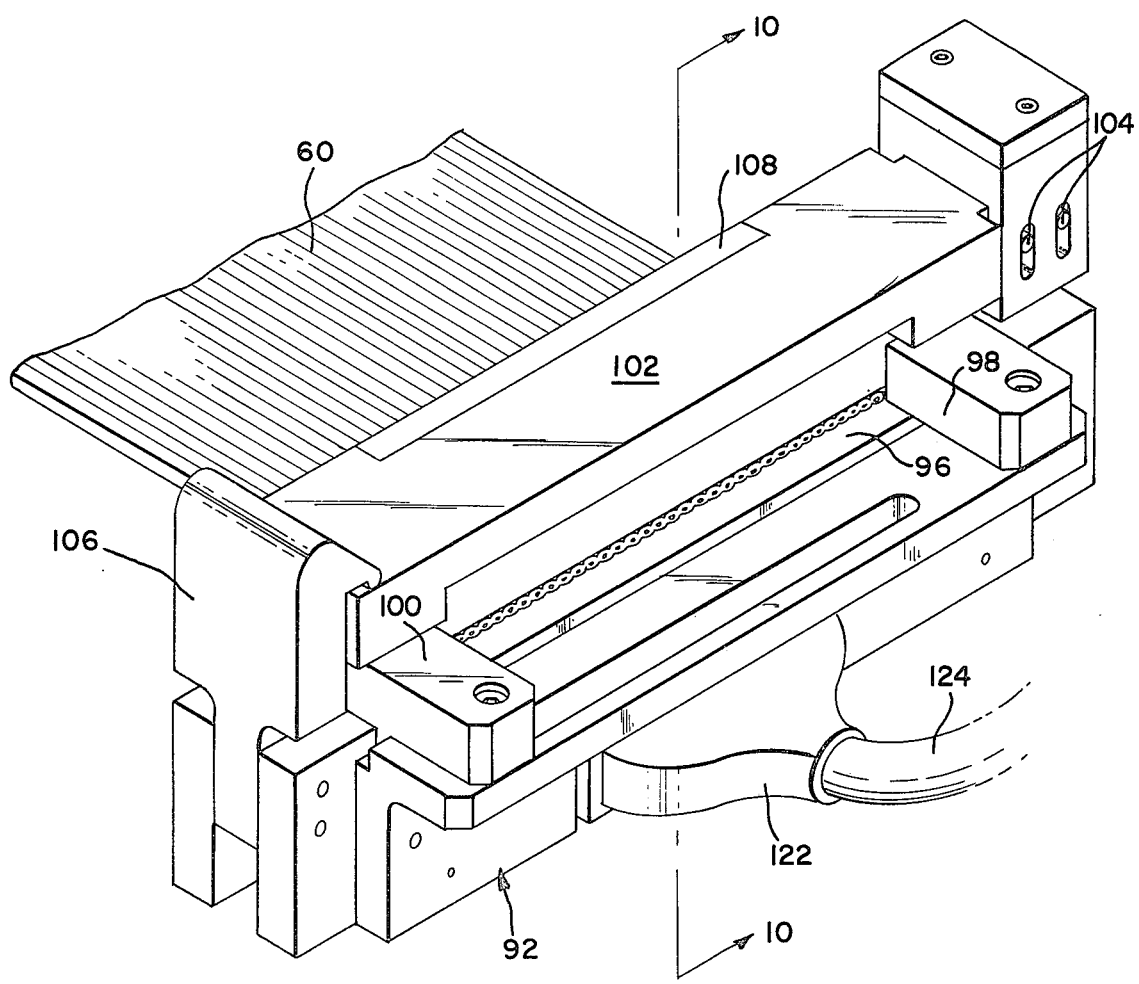
FIG. 9 is an enlarged detailed view of the test fixture according to the alternate embodiment of the present invention.

An alternate embodiment of the test fixture is shown in FIGS. 9 and 10. This embodiment of the fixture 92 includes base member 94 having a connector receiving face 96 with connector guide members 98, 100 thereon in fixed, parallel, spaced relation. A cover member 102 is pivotally attached at one end of the base member by hinge means 104 and is secured at the other end by latch means 106. The cover includes a strain relief portion 108 which, together with face 110 of the base member, effect a strain relief for cable 60. The connector receiving face 96 includes a plurality of contact passages 112 with a pin contact 114 mounted in each passage. Each pin contact 114 is biased toward connector receiving face 96 by a respective spring 116 and connected by conductor 118 to a connector member 120. A mating connector member 122 is attached to cable 124 which is in turn connected to the test indicator station 16.

A block level electrical schematic of the test indicating station 16 is shown in FIG. 11 to explain how the connections are tested. Also schematically shown are press 55, which electrically at ground, a first connector 66 terminated to cable 60 and engaged in test fixture 92, and cable 124 connecting the test fixture to the indicator 16.

The indicator station includes a counter 126 connected to sequentially interrogate demultiplexer 128 and multiplexer 130 which are connected in parallel to the test fixture. The outputs of the counter 126, demultiplexer 128 and multiplexer 130 are fed to a first comparator 132. The output of the counter 126 is also fed to a digital display unit 134 and a second comparator 136. A thumb wheel or other set switch 138 is connected to the second comparator 136 and the output thereof is connected to the first comparator 132. A test selection switch 140 is connected to the first comparator 132 and the output thereof is connected to panel display lights 142.

In operation, the switch 138 is set for the number of connections to be tested, the cable terminated by the first connector and that connector is engaged with the test fixture. Upon crimping of the second connector to the cable, the counter 126 sequentially interrogates the demultiplexer 128 and multiplexer 130 to test the connections by grounding, to test for "open" and opening, to test for "short". The outputs of the counter 126, demultiplexer 128 and multiplexer 130 are fed to the first comparator 132 along with the output of the second comparator 136 which, in effect, instructs the first comparator 132 to ignore all counts above those set by switch 138. The results of the connection test are indicated by a series of panel lights noting testing, end of test, open and short. The location of the faulty connection will be indicated by the count in the digital display.

As with the previous embodiment, the first connector 66 crimped onto the cable 60 is inserted into the test fixture 92, shown in FIGS. 9 and 10. The contacts 126 of the connector 66 extend through apertures 112 to engage the test pins 114 of the test fixture 92.

The sequence of assembly operations is identical with that previously described in that the connectors are sequentially crimped onto the cable at the appropriate position. Each time the crimping action takes place, the device gives a readout indicating shorts and/or open circuits.

The present invention may be subject to many modifications and changes without departing from the spirit or essential characteristics of the invention. The embodiments described herein are therefore to be considered in all respects as illustrative and not restrictive of the scope of the invention.

What is claimed is:

1. A method of fabricating cable harnesses of multi-conductor flexible cable terminated with at least two electrical connectors while simultaneously testing each connection for electrical continuity as the connection is effected, comprising the steps of:

feeding a first end of a multi-conductor flat flexible cable to a terminating station;

terminating said first end of said multi-conductor flat flexible cable with a first electrical connector having therein a plurality of contact terminals, each said terminal having an insulation piercing portion adapted to engage a respective conductor of the cable;

indexing said cable to engage said terminated first connector in a test fixture having therein terminals contacting each terminal of said first connector while presenting a subsequent portion of said cable to said terminating station; and terminating said subsequent portion of said cable with a next successive electrical connector while electrically testing each connection of each said successive electrical connector simultaneously with termination of each said successive electrical connector on said cable.

2. A method according to claim 1 wherein said step of electrical testing includes:

grounding to test for "open" and opening to test for "short".

3. A method of fabricating cable harnesses according to claim 1 further comprising the step of:

straightening said multi-conductor cable as it is unwound from a reel thereby facilitating handling.

4. A method of fabricating cable harnesses according to claim 1 further comprising the steps of:

preloading a plurality of connectors in carriers; and sequencing the loaded carriers and said cable through said terminating station to effect termination of the cable with the respective connectors at a desired spacing.

5. A method of fabricating cable harnesses according to claim 4 further comprising the step of:

feeding the terminated cable through said terminating station; and applying covers to said connectors to enclose said terminated cable.

* * * * *